United States Patent
Lee

(10) Patent No.: US 11,353,644 B2
(45) Date of Patent: Jun. 7, 2022

(54) DISPLAY DEVICE HAVING BLENDED DISPLAY PANEL

(71) Applicant: a.u. Vista, Inc., Irvine, CA (US)

(72) Inventor: Seok-Lyul Lee, Irvine, CA (US)

(73) Assignee: A. U. VISTA, INC., Irvine, CA (US)

( * ) Notice: Subject to any disclaimer, the term of this patent is extended or adjusted under 35 U.S.C. 154(b) by 138 days.

(21) Appl. No.: 17/060,787

(22) Filed: Oct. 1, 2020

(65) Prior Publication Data
US 2022/0107452 A1   Apr. 7, 2022

(51) Int. Cl.
| | |
|---|---|
| G02F 1/1335 | (2006.01) |
| G02B 5/30 | (2006.01) |
| H01L 25/16 | (2006.01) |
| G02F 1/1339 | (2006.01) |
| C23C 14/34 | (2006.01) |
| C23C 14/58 | (2006.01) |
| C23C 14/14 | (2006.01) |
| G02F 1/1368 | (2006.01) |

(52) U.S. Cl.
CPC ............ *G02B 5/3058* (2013.01); *C23C 14/14* (2013.01); *C23C 14/34* (2013.01); *C23C 14/5886* (2013.01); *G02F 1/1339* (2013.01); *G02F 1/133536* (2013.01); *H01L 25/16* (2013.01); *H01L 25/167* (2013.01); *G02F 1/1368* (2013.01); *G02F 1/133531* (2021.01); *G02F 1/133548* (2021.01)

(58) Field of Classification Search
CPC ....... G02B 5/3058; C23C 14/14; C23C 14/34; C23C 14/5886; G02F 1/133536; G02F 1/1339; G02F 1/133531; G02F 1/133548; G02F 1/1368; H01L 25/16; H01L 25/167
See application file for complete search history.

(56) References Cited

U.S. PATENT DOCUMENTS

| | | | |
|---|---|---|---|
| 7,961,393 B2 | 6/2011 | Perkins et al. | |
| 9,625,761 B2 | 4/2017 | Lee et al. | |
| 2011/0052802 A1* | 3/2011 | Kaida | G02F 1/133536 427/163.1 |
| 2014/0354923 A1* | 12/2014 | Lee | G02F 1/133536 349/96 |

(Continued)

FOREIGN PATENT DOCUMENTS

JP   2011257678 A   12/2011

*Primary Examiner* — Hoan C Nguyen
(74) *Attorney, Agent, or Firm* — Tim Tingkang Xia, Esq.; Locke Lord LLP

(57) ABSTRACT

A blended display device is provided. The display device includes a display panel having a first substrate located at a back side and a second substrate located at a display side, and a directional nanowire grid polarizer (NWGP) layer disposed on the second substrate. The display panel is switchable between first and second operational modes. The directional NWGP layer has a NWGP direction. The directional NWGP layer includes at least one colored coating disposed on at least one pattern region. In the first operational mode, the directional NWGP layer functions as a polarizer for the display panel, and the display panel is used to display an image. In the second operational mode, the display panel does not display an image, and an ambient light incident toward the display panel is at least partially reflected by the pattern region of the directional NWGP layer to show a predesigned color pattern.

20 Claims, 8 Drawing Sheets

(56) References Cited

U.S. PATENT DOCUMENTS

2016/0291227 A1* 10/2016 Nielson ............. C23C 16/45555
2017/0285400 A1* 10/2017 Park .................. G02F 1/133536
2018/0136382 A1   5/2018 Kwak et al.

* cited by examiner

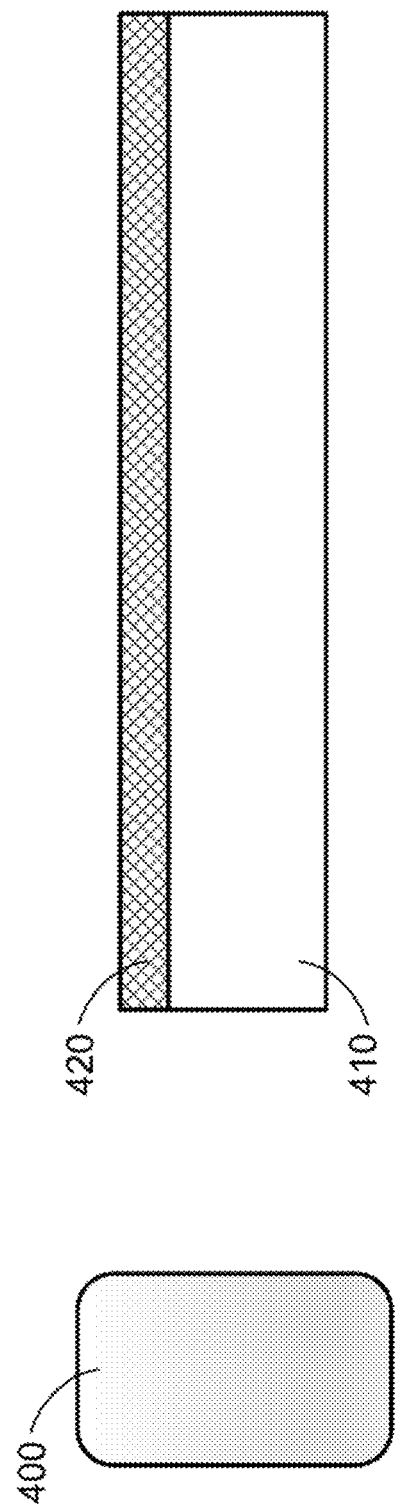
FIG. 4A
FIG. 4B
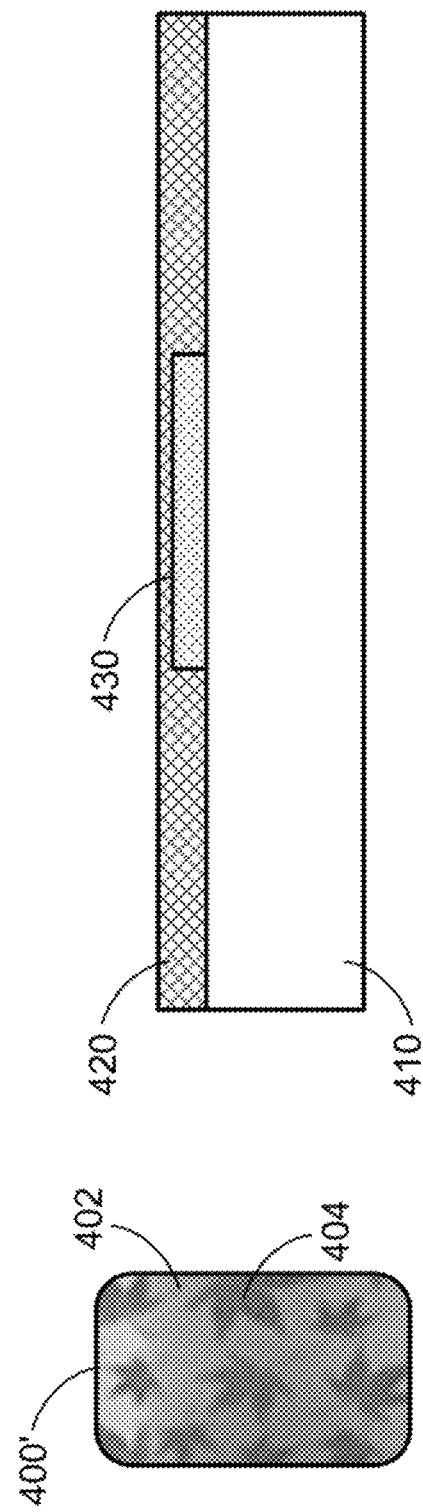
FIG. 4C
FIG. 4D

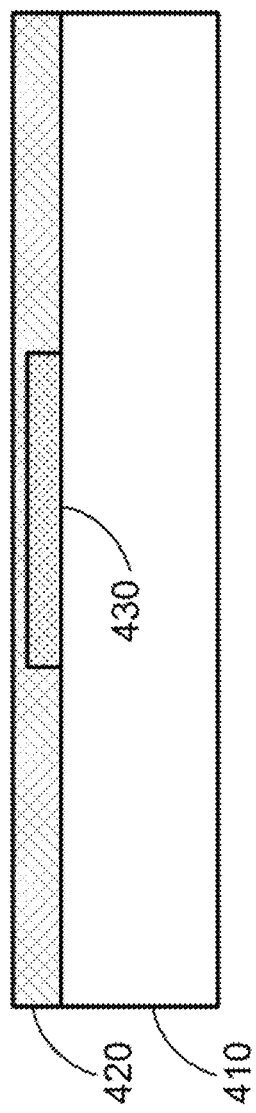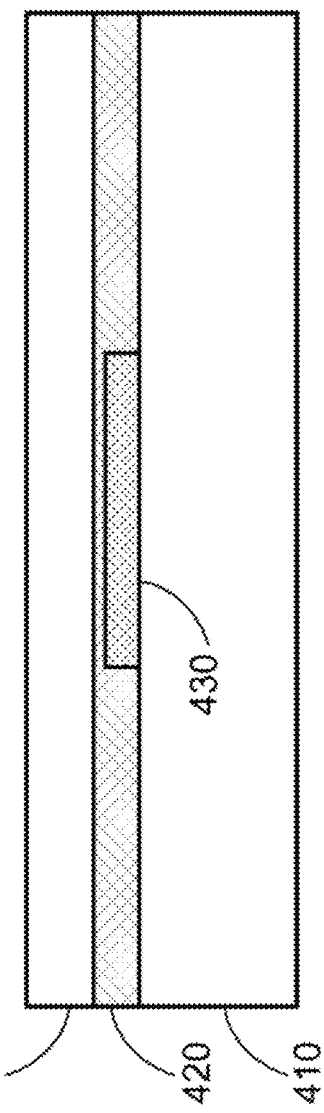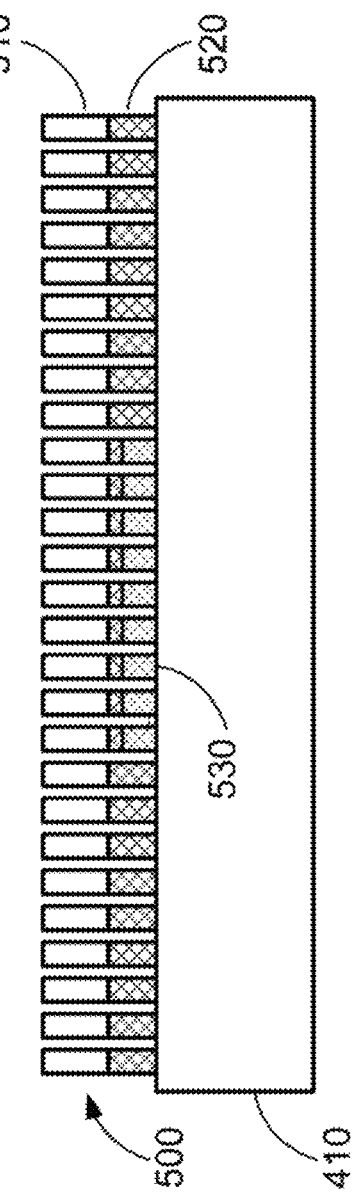

DISPLAY DEVICE HAVING BLENDED DISPLAY PANEL

FIELD

The disclosure relates generally to display technology, and more particularly to a display device having a blended display panel with a directional nanowire grid polarizer (NWGP) layer.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Distracting screens inhabit almost every aspect of our modern lives. However, a blended display, such as a wooden display, provides hopes to change this by offering a calm and focused home screen display. When the wooden display is not in use, all traces of technology vanish, leaving behind a warm, wooden facade.

Currently, one way of forming the blended display is to put a thin film in front of a regular display. The thin film may be semi-opaque to display the pattern of the blended display, such as a wooden pattern for the wooden display. However, the semi-opaque thin film may reduce brightness and image clearance of the display.

Therefore, a heretofore unaddressed need exists in the art to address the aforementioned deficiencies and inadequacies.

SUMMARY

One aspect of the disclosure relates to a display device, which includes: a display panel configured to switch between a first operational mode and a second operational mode, wherein the display panel has a first substrate and a second substrate opposite to each other in a vertical direction, the first substrate is located at a back side of the display panel, and the second substrate is located at a display side of the display panel; and a directional nanowire grid polarizer (NWGP) layer disposed on the second substrate, wherein the directional NWGP layer has a NWGP direction perpendicular to the vertical direction, and the directional NWGP layer comprises at least one colored coating disposed on at least one pattern region. In the first operational mode, the directional NWGP layer functions as a polarizer for the display panel, and the display panel is configured to display an image; and in the second operational mode, the display panel does not display an image, and an ambient light incident toward the display panel is at least partially reflected by the at least one pattern region of the directional NWGP layer to show a predesigned color pattern.

In certain embodiments, the display panel is a liquid crystal display (LCD) panel comprising: a backlight module configured to switch between the first operational mode and the second operational mode; and a display cell structure, comprising: the first substrate and the second substrate spaced apart from each other in the vertical direction, forming a cell gap therebetween, wherein the first substrate has a first side facing the cell gap and a second side opposite to the first side and facing the backlight module, and the directional NWGP layer is disposed on the second substrate; a polarizer layer disposed on the second side of the first substrate, wherein the polarizer layer has a polarizing direction perpendicular to the NWGP direction and the vertical direction; and a LCD structure disposed in the cell gap, having liquid crystal molecules with a dielectric constant anisotropy; wherein in the first operational mode, the backlight module emits light toward the display cell structure, the polarizer layer polarizes the light emitted by the backlight module, and the LCD structure is controlled to allow the polarized light polarized by the polarizer layer to pass through the LCD structure and the directional NWGP layer and to display the image; and wherein in the second operational mode, the backlight module does not emit light toward the display cell structure, and the ambient light incident toward the display cell structure is at least partially reflected by the directional NWGP layer to show the predesigned color pattern.

In certain embodiments, the second substrate has a third side facing the cell gap and a fourth side opposite to the third side, and the directional NWGP layer is disposed on the third side of the second substrate.

In certain embodiments, the second substrate has a third side facing the cell gap and a fourth side opposite to the third side, and the directional NWGP layer is disposed on the fourth side of the second substrate.

In certain embodiments, the LCD structure comprises: a liquid crystal layer disposed in the cell gap, having the liquid crystal molecules and defining a plurality of pixels; and an active matrix layer disposed on the first side of the first substrate, wherein the active matrix layer comprises a plurality of pixel circuits corresponding to the pixels; wherein for each of the pixels, in the first operational mode, the pixel circuits of the active matrix layer correspondingly provide a voltage to drive the liquid crystal molecules of the liquid crystal layer to allow the polarized light polarized by the polarizer layer to pass through the liquid crystal layer and the directional NWGP layer to display an image.

In certain embodiments, the LCD panel further comprises at least one sealant disposed in the cell gap to seal the liquid crystal molecule within the LCD structure, and the directional NWGP layer overlaps with a projection of the at least one sealant along the vertical direction.

In certain embodiments, the display panel is a light emitting diode (LED) display panel comprising: the first substrate and the second substrate spaced apart from each other in the vertical direction, wherein the directional NWGP layer is disposed on a side of the second substrate away from the first substrate; a LED array disposed between the first substrate and the second substrate, having a plurality of LEDs and defining a plurality of pixels; and a quarter wave plate disposed between the directional NWGP layer and the second substrate; wherein in the first operational mode, the LED array emits light, and the directional NWGP layer polarizes the light emitted by the LED array to display the image; and wherein in the second operational mode, the LED array does not emit light, and the ambient light incident toward the LED display panel is at least partially reflected by the directional NWGP layer to show the predesigned color pattern.

In certain embodiments, each of the LEDs is an organic LED (OLED).

In certain embodiments, the directional NWGP layer is formed by a plurality of wire grid lines extending in parallel along the NWGP direction, and a pitch between the wire grid lines is less than $\lambda/2$, wherein $\lambda$ is a wavelength of the light.

In certain embodiments, a space between two adjacent ones of the wire grid lines is in a range between 50 nm and 100 nm, a width of each of the wire grid lines is in a range between 50 nm and 100 nm, and a height of each of the wire grid lines along the vertical direction is in a range between 150 nm and 350 nm.

In certain embodiments, the directional NWGP layer comprises a plurality of colored coatings forming a plurality of pattern regions, each of the pattern regions is formed by a corresponding metal alloy, and in the second operational mode, the ambient light incident toward the display panel is at least partially reflected by the pattern regions to shown a multi-colored texture as the predesigned color pattern.

In certain embodiments, the colored coatings are formed by a plurality of metal alloys, each of the pattern regions corresponds to a different one of the metal alloys, and each of the metal alloys is selected from a group consisting of: $Al_2O_3$, $V_2O_3$, $Cr_2O_3$, $TiO_2$, NiO, (TiAl)N, $TiN_x$, ZrN, TiZrN, TiCN, TaN, SiC, TiAlCN, TiC, WC, $TiC_xN_y$, $ZrC_xN_y$, or a combination thereof.

In certain embodiments, the display device further includes: a piezoelectric polymer layer disposed on a side of the second substrate away from the first substrate, wherein an external alternate current (AC) electric field is applied to the piezoelectric polymer layer such that the piezoelectric polymer layer generates a mechanical vibration.

In certain embodiments, the piezoelectric polymer layer is a polyvinylidene fluoride (PVDF) layer.

In certain embodiments, the external AC electric field is generated by providing a first AC signal to the directional NWGP layer which is conductive material and a second AC signal to a transparent conductive electrode layer, wherein the piezoelectric polymer layer is disposed between the directional NWGP layer and the transparent electrode layer, and the first AC signal and the second AC signal have different frequencies.

In certain embodiments, the display device further includes a transparent electrode layer disposed between the second substrate and the piezoelectric polymer layer, wherein the at least one directional NWGP layer is disposed on the piezoelectric polymer layer such that the piezoelectric polymer layer is sandwiched by the transparent electrode layer and the at least one directional NWGP layer.

In another aspect of the disclosure, a method of forming the directional NWGP layer of the display device as described above is provided. In certain embodiments, the method includes: forming one or more color coating layers on the second substrate by sputtering the metal alloys or by reactive plasma deposition of the metal alloys; forming an aluminum layer on the color coating layers; and imprinting the aluminum layer and the color coating layers to form a plurality of wire grid lines extending in parallel along the NWGP direction, wherein the wire grid lines form the directional NWGP layer, and the color coating layers form the colored coatings.

In certain embodiments, a pitch between the wire grid lines is less than $\lambda/2$, wherein $\lambda$ is a wavelength of the light.

In certain embodiments, a space between two adjacent ones of the wire grid lines is in a range between 50 nm and 100 nm, a width of each of the wire grid lines is in a range between 50 nm and 100 nm, and a height of each of the wire grid lines along the vertical direction is in a range between 150 nm and 350 nm.

In certain embodiments, each of the pattern regions corresponds to a different one of the metal alloys, and each of the metal alloys is selected from a group consisting of: $Al_2O_3$, $V_2O_3$, $Cr_2O_3$, $TiO_2$, NiO, (TiAl)N, $TiN_x$, ZrN, TiZrN, TiCN, TaN, SiC, TiAlCN, TiC, WC, $TiC_xN_y$, $ZrC_xN_y$, or a combination thereof.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 4A schematically shows a blended display device with a predesigned pattern according to one embodiment of the present disclosure.

FIG. 4B schematically shows a partial cross-sectional view of a pre-manufactured directional NGWP layer of the blended display device as shown in FIG. 4A.

FIG. 4C schematically shows a blended display device with a predesigned pattern according to one embodiment of the present disclosure.

FIG. 4D schematically shows a partial cross-sectional view of a pre-manufactured directional NGWP layer of the blended display device as shown in FIG. 4C.

FIGS. 5A to 5C schematically show the process of forming the directional NGWP layer manufactured from the pre-manufactured directional NGWP layer as shown in FIG. 4D.

DETAILED DESCRIPTION OF THE DISCLOSURE

Figure 1:
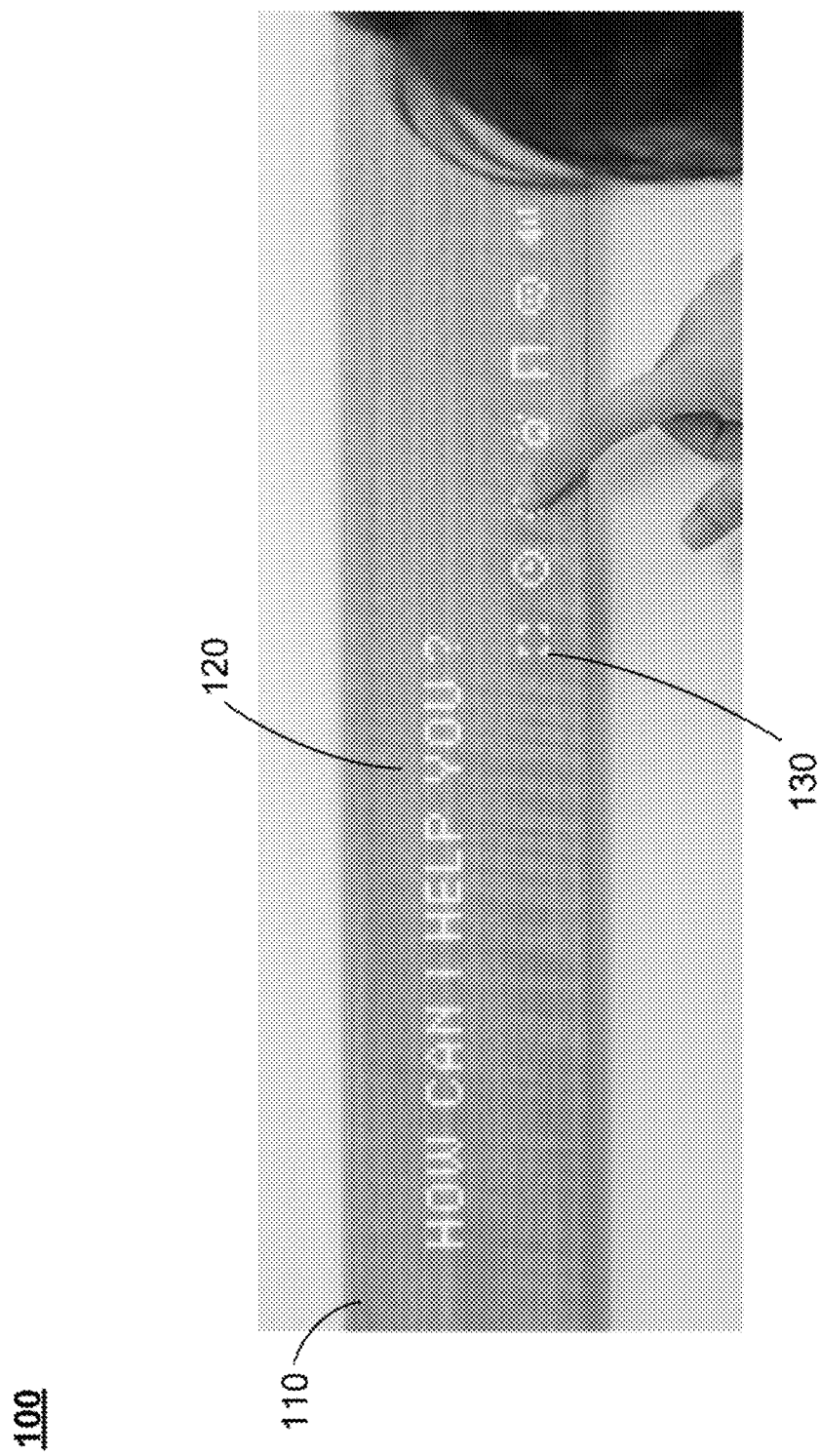
FIG. 1 schematically shows a blended display device with a wooden pattern according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a blended display device.

FIG. 1 schematically shows a blended display device with a wooden pattern according to certain embodiment of the present disclosure. As shown in FIG. 1, the blended display device 100 may have a display panel 110 having a wooden pattern, and certain texts 120 and symbols 130 are displayed on the display panel. As discussed above, one way of forming the blended display device may be using a semi-opaque thin film on a display side of a regular display device, but the semi-opaque thin film may reduce brightness and image clearance of the display device.

To remedy this deficiency, in one aspect of the disclosure, a blended display device may be formed by providing a directional nanowire grid polarizer (NWGP) layer in the display panel of the display device. Specifically, the directional NWGP layer has a NWGP direction perpendicular to a vertical direction of the display panel, and the directional NWGP layer includes at least one colored coating disposed on at least one pattern region to form the blended pattern of the blended display device. The display device is switchable between a first operational mode (which is a display mode) and a second operation mode (which is a reflection mode). In the first operational mode, the directional NWGP layer functions as a polarizer for the display panel, and the display panel may be used to display an image. In the second operational mode, the display panel does not display an image, and an ambient light incident toward the display panel is at least partially reflected by the at least one pattern region of the directional NWGP layer to show a predesigned color pattern. In this case, the blended display device may perform well without reducing the brightness of the display device.

Figure 2A:
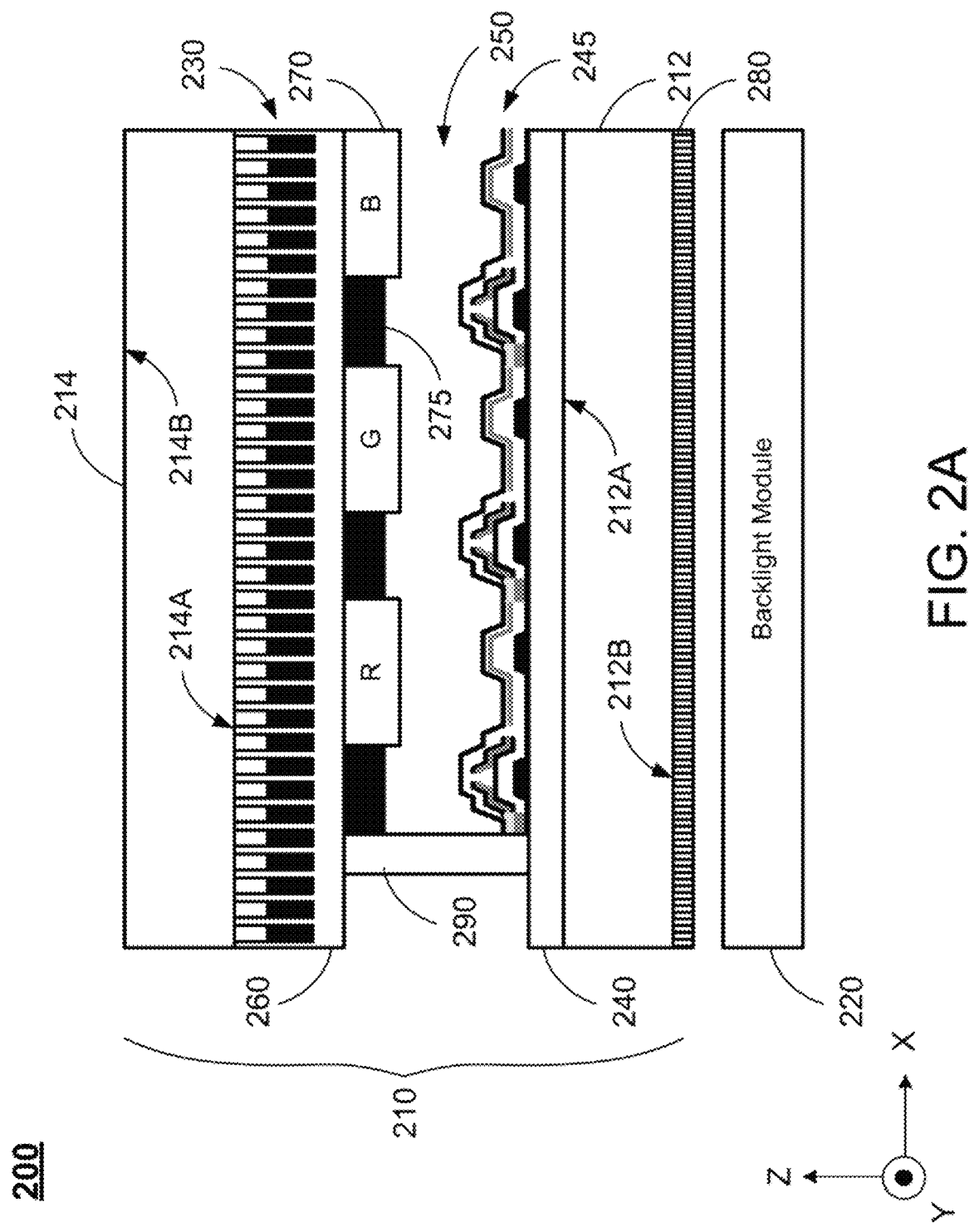
FIG. 2A schematically shows a blended liquid crystal display (LCD) device according to one embodiment of the present disclosure.

FIG. 2A schematically shows a blended liquid crystal display (LCD) device according to one embodiment of the present disclosure. Specifically, for description purposes, a three-dimensional X-Y-Z coordinate is provided in FIG. 2A, in which the X-axis direction represents a width direction of the blended LCD device 200, the Y-axis direction represents a length direction of the blended LCD device 200, and the Z-axis direction represents a vertical direction of the blended LCD device 200. In particular, the position direction of the Z-axis direction is a forward direction, and the negative direction of the Z-axis direction is a backward direction.

As shown in FIG. 2A, the LCD device 200 includes a display panel 210 and a backlight module 220 disposed at a back side (i.e., the bottom side as shown in FIG. 2A) of the display panel 210. The backlight module 220 is used to emit light toward the display panel 210. The display panel 210 is a LCD panel, which functions as the display cell structure of the LCD device, and is switchable between a first operational mode (i.e., the display mode) and a second operational mode (i.e., the reflection mode), and the backlight module 220 is also correspondingly switchable between the first operational mode and the second operational mode. Specifically, the display panel 210 has a first substrate 212 and a second substrate 214 opposite to each other in the Z-axis direction (i.e., the vertical direction), in which the first substrate 212 is located at the back side (i.e., the bottom side as shown in FIG. 2A) of the display panel 210, and the second substrate 214 is located at a display side (i.e., the front side or the top side as shown in FIG. 2A) of the display panel 210. A liquid crystal layer 250 is formed in a cell gap between the first substrate 212 and the second substrate 214. The liquid crystal layer 250 is formed with liquid crystal molecules with a dielectric constant anisotropy, which may be positive or negative, and is used to define a plurality of pixels. In this case, the liquid crystal molecules may be aligned homeotropically or homogeneously. A sealant structure 290 is disposed in the cell gap to seal a side of the cell gap such that the liquid crystal molecule in the liquid crystal layer 250 may be sealed within the cell gap. The first substrate 212 has a first side 212A and a second side 212B opposite to each other, in which the first side 212A (i.e., the upper side as shown in FIG. 2A) faces the liquid crystal layer 250, and the second side 212B (i.e., the lower side as shown in FIG. 2A) faces the backlight module 220. Similarly, the second substrate 214 has a third side 214A and a fourth side 214B opposite to each other, in which the third side 214A (i.e., the lower side as shown in FIG. 2A) faces the liquid crystal layer 250, and the fourth side 214B (i.e., the upper side as shown in FIG. 2A) faces the outer environment. At the first substrate 212, an active matrix layer 240 is formed on the first side 212A of the first substrate 212 facing the liquid crystal layer 250, and a plurality of active matrix switching devices 245 are provided on the active matrix layer 240 and corresponding to the pixels. In particular, the active matrix switching devices 245 include pixel circuits and thin-film transistors (TFTs) corresponding to the pixels. The active matrix layer 240, the active matrix switching devices 245 and the liquid crystal layer 250 collectively form a LCD structure of the LCD panel 200. Further, a polarizer layer 280 is formed on the second side of the first substrate 212 facing the backlight module 220. At the side of the second substrate 214, a directional NWGP layer 230 and a quarter wave plate 260 are disposed on the third side of the second substrate 214 facing the liquid crystal layer 250. Further, a plurality of color filter structures 270 are disposed on the quarter wave plate 260 facing the liquid crystal layer 250, and a plurality of black matrix structures 275 are formed between the color filter structures 270. In other words, the directional NWGP layer 230 and the color filter structures 270 are disposed on the same second substrate 214. However, in other embodiments, the directional NWGP layer 230 and the color filter structures 270 may be disposed on different substrates, and is thus not limited thereto. The polarizing directions of the polarizer layer 280 and the directional NWGP layer 230 (which may function as a polarizer) are perpendicular to each other.

Figure 2B:
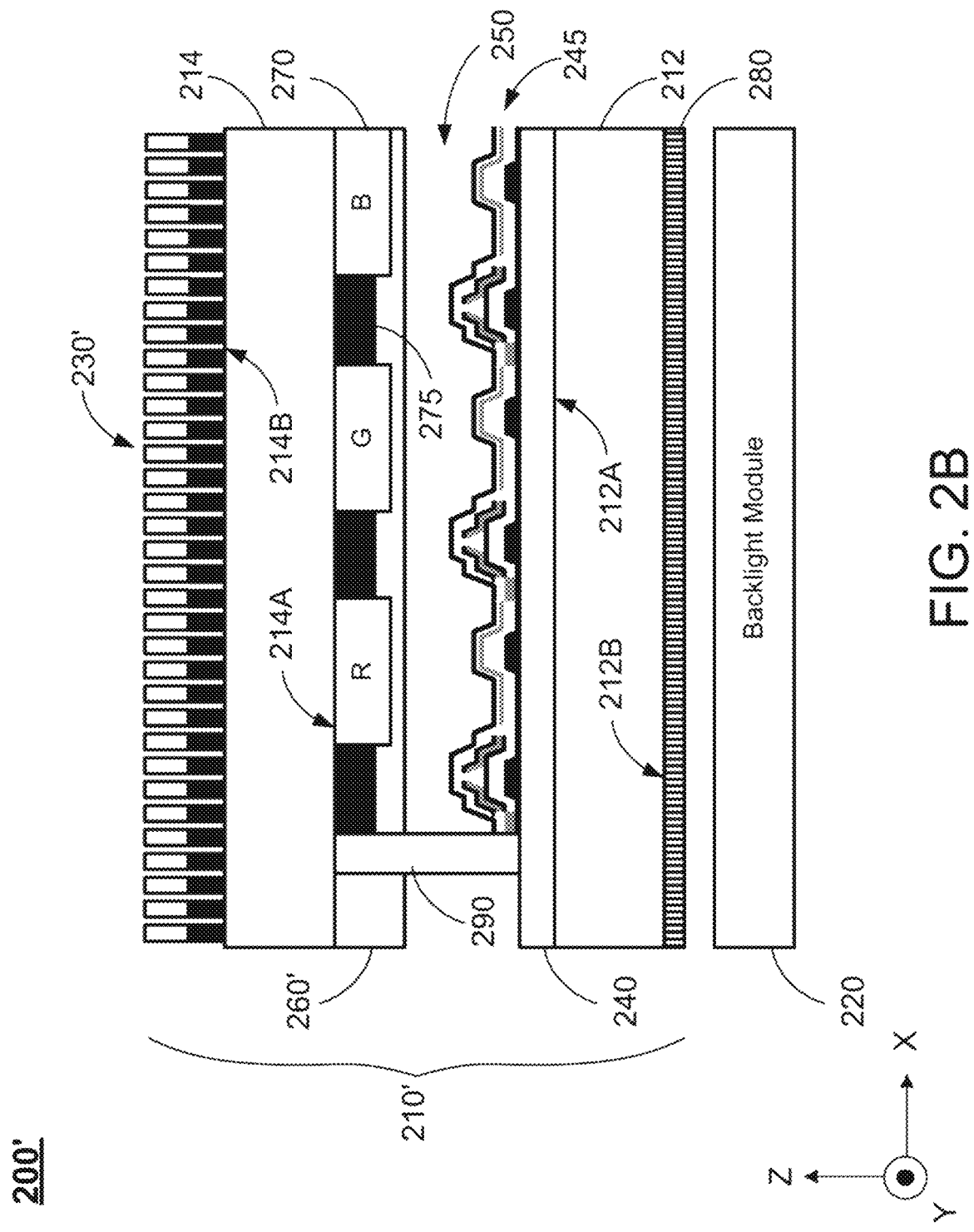
FIG. 2B schematically shows a blended LCD device according to one embodiment of the present disclosure.

FIG. 2B schematically shows a blended LCD device according to another embodiment of the present disclosure. Specifically, FIG. 2B adopts the same three-dimensional X-Y-Z coordinate as provided in FIG. 2A. As shown in FIG. 2B, the LCD device 200' includes a display panel 210' and a backlight module 220 disposed at a back side (i.e., the bottom side as shown in FIG. 2B) of the display panel 210'. The differences between the display panel 210' as shown in FIG. 2B and the display panel 210 as shown in FIG. 2A exist in the structures disposed on the second substrate 214. Specifically, a directional NWGP layer 230' is disposed on the fourth side 214B of the second substrate 214 facing the outer environment, and a quarter wave plate 260' is disposed on the third side 214A of the second substrate 214 facing the liquid crystal layer 250. In other words, the directional NWGP layer 230' and the quarter wave plate 260' are disposed on the two opposite sides of the second substrate 214. Further, the color filter structures 270 are disposed directly on the third side 214A of the second substrate 214 facing the liquid crystal layer 250, and the black matrix structures 275 are formed between the color filter structures 270. Other structures of the display panel 210', including the active matrix layer 240, the active matrix switching devices 245, the liquid crystal layer 250, the polarizer layer 280 and the sealant structure 290, are similar or identical to those of the display panel 210 as shown in FIG. 2A, and are not hereinafter elaborated.

In certain embodiments, as shown in each of FIGS. 2A and 2B, the directional NWGP layer 230 or 230' overlaps with a projection of the sealant structure 290 along the vertical direction.

Figure 3:
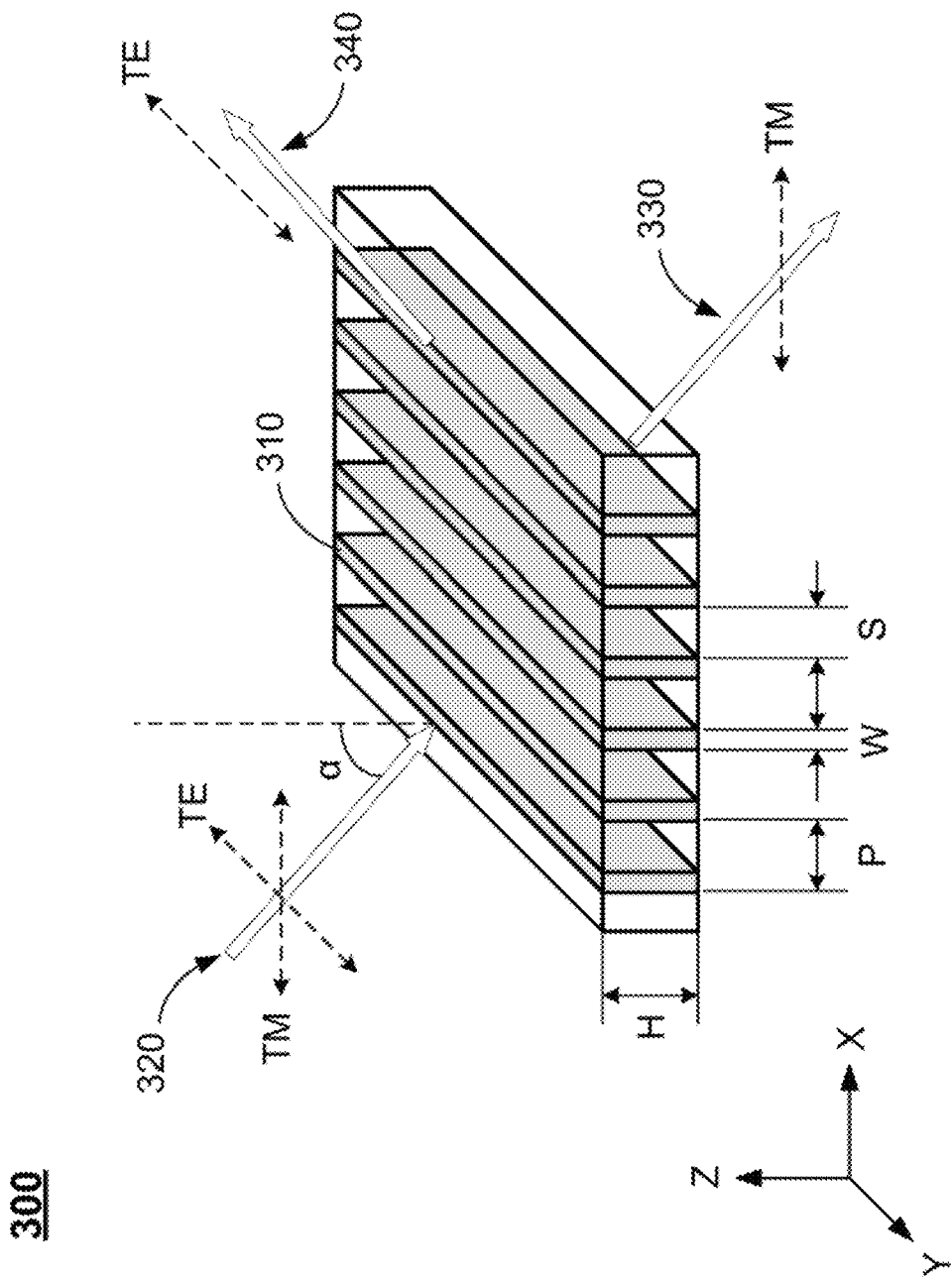
FIG. 3 schematically shows a directional nanowire grid polarizer (NWGP) layer according to one embodiment of the present disclosure.

FIG. 3 schematically shows a directional NWGP layer according to one embodiment of the present disclosure. Specifically, FIG. 3 adopts the same three-dimensional X-Y-Z coordinate as provided in FIG. 2A. As shown in FIG. 3, the directional NWGP layer 300 includes a plurality of wire grid lines 310 formed by aluminum (Al) and extending in parallel along a NWGP direction (i.e., the Y-axis direction as shown in FIG. 3). However, in other embodiments, the wire grid lines 310 may be formed by other conductive materials instead of aluminum, and are thus not limited thereto. Each nanowire line 310 has a width W along the X-axis direction and a height H along the Z-axis direction, and the wire grid lines 310 in the directional NWGP layer 300 are arranged in a pitch P. Specifically, the Z-axis direction may be the vertical direction of the display panel 210 as shown in FIG. 2A or the display panel 210' as shown in FIG. 2B. In other words, when the directional NWGP layer 300 is disposed in the display panel 210 or 210', the NWGP direction (i.e., the Y-axis direction as shown in FIG. 3) of the directional NWGP layer 300 is perpendicular to the vertical direction (i.e., the Z-axis direction as shown in FIG. 3). The directional NWGP layer 300 may function as follows: when an incident light 320 is incident on the directional NWGP layer 300, the incident light 320 is unpolarized. In other words, the incident light 320 includes both transverse electric (TE) portions along the extending direction of the wire grid lines 310 and transverse magnetic TM portions perpendicular to the extending direction of the wire grid lines 310. The TM portions of the light (light polarized perpendicular to the NWGP direction of the wire grid lines 310) are transmitted through the directional NWGP layer 300 to become the transmitted light 330, and the TE portions of the light (light polarized along the NWGP direction of the wire grid lines 310) are reflected by the directional NWGP layer 300 to become the reflected light 340. In certain embodiments, the pitch P of the direction NWGP layer 300 (which equals to a sum of the width of one wire grid line 310 and a space S between two adjacent wire grid lines 310) must be subwavelength, which is less than $\lambda/2$, where $\lambda$, is a wavelength of the light. For example, the pitch P may be set as 200 nm based on the wavelength of the visible light ($\lambda \geq 400$ nm). In certain embodiments, the space S may be in a range between 50 nm and 100 nm, the width W may be in a range between 50 nm and 100 nm, and the height H may be in a range between 150 nm and 350 nm. In one embodiment, the width W may be 75 nm, and the height H may be 250 nm.

The operation of the blended display device with the directional NWGP layer 300 may be described in details using the blended display device 200 as shown in FIG. 2A as an exemplary embodiment. In other words, the directional NWGP layer 300 is used as the directional NWGP 230 as shown in FIG. 2A. It should be noted that other embodiments of the blended display device, such as the blended display device 200' as shown in FIG. 2B, may function similarly, and details of the operation thereof are not further elaborated.

As discussed, in the blended display device 200 as shown in FIG. 2A, the display panel 210 and the backlight module 220 are correspondingly switchable between the first operational mode and the second operational mode. In the first operational mode (i.e., the display mode), the display panel 210 and the backlight module 220 are both in operation to display an image, and in this case, the directional NWGP layer 230 functions as a polarizer for the display panel 210. Specifically, the backlight module 220 emits light toward the display panel 210, and the polarizer layer 280 polarizes the light emitted by the backlight module 220. The polarized light continues to transmit toward the LCD structure formed by the active matrix layer 240, the active matrix switching devices 245 and the liquid crystal layer 250, and the LCD structure is controlled to allow the polarized light to pass through the LCD structure. In particular, for each of the pixels, the pixel circuits in the active matrix switching devices 245 in the pixel correspondingly provide a voltage to drive the liquid crystal molecules of the liquid crystal layer 250 in the pixel to be oriented to desired directions, thus allowing (or not allowing) the polarized light to pass through the liquid crystal layer 250 for the pixel. Once the polarized light passes through the LCD structure, the polarized light then passes through the color filter structures 270, the quarter wave plate 260 and the directional NWGP layer 230 to emit outward to display the image, such that a viewer at the outer environment may perceives the light emitted from the display panel and see the image displayed on the display device.

On the other hand, in the second operational mode (i.e., the reflection mode), the display panel 210 and the backlight module 220 are both in the off-mode without displaying an image. In other words, the backlight module 220 does not emit light toward the display panel 210. In this case, the directional NWGP layer 230 functions as a reflector, and an ambient light incident toward the display panel 210 is at least partially reflected by the directional NWGP layer 230 to show a predesigned color pattern.

In order to show the predesigned color pattern in the second operational mode, the directional NWGP layer 230 may be predesigned to include at least one colored coating disposed on at least one pattern region. For example, FIG. 4A schematically shows a blended display device with a predesigned pattern according to one embodiment of the present disclosure, and FIG. 4B schematically shows a partial cross-sectional view of a pre-manufactured directional NGWP layer of the blended display device as shown in FIG. 4A. As shown in FIG. 4A, the whole display area 400 of the blended display is in the same color pattern. Thus, a color coating layer 420 may be disposed on a NWGP substrate 410 to form a pre-manufactured directional NGWP layer, as shown in FIG. 4B. On the other hand, FIG. 4C schematically shows a blended display device with a predesigned pattern according to one embodiment of the present disclosure, and FIG. 4D schematically shows a partial cross-sectional view of a pre-manufactured directional NGWP layer of the blended display device as shown in FIG. 4C. As shown in FIG. 4C, the whole display area 400' of the blended display is intended to show a more complex multi-color pattern with multiple pattern regions 402 and 404. Thus, two different color coating layers 420 and 430 may be disposed on the NWGP substrate 410 to correspond to the pattern regions 402 and 404, thus forming the pre-manufactured directional NGWP layer, as shown in FIG. 4D. Specifically, each of the two color coating layers 420 and 430 may be formed by a corresponding metal alloy.

FIGS. 5A to 5C schematically show the process of forming the directional NGWP layer manufactured from the pre-manufactured directional NGWP layer as shown in FIG. 4D. As shown in FIG. 5A, the pre-manufactured directional NGWP layer as shown in FIG. 4D is provided, with the color coating layers 420 and 430 being formed on the NWGP substrate 410 by sputtering or reactive plasma deposition of the corresponding materials. As shown in FIG. 5B, an aluminum layer 440 is then formed (e.g., by sputtering or other deposition methods) on the color coating layers 420 and 430. Then, the aluminum layer 440 as well as the color coating layers 420 and 430 are imprinted to form the wire grid lines 500 as shown in FIG. 5C, where each wire grid line 500 is formed by the aluminum portion 510 and the colored coating portions 520 and 530, thus forming multiple pattern regions. Thus, in the second operational mode, the ambient light incident toward the display panel is at least partially reflected by the multiple pattern regions to shown a multi-colored texture as the predesigned color pattern.

The coating layers 420 and 430 as shown in FIGS. 5A-5C, which correspond to the pattern regions of the directional NWGP layer, may be formed using different colored coating materials. Specifically, each of the coating layers 420 and 430 may correspond to a specifically different colored coating material. Currently, colored coating materials that display metallic reflection appear everywhere in the commercial world. For example, decorative coatings are applied to jewelry, personalized objects such as eye glass frames, watches and pens, automobile and home fixtures, glass art, architectural windows and even sports equipment, multimedia and fashion. A wide range of colors can be produced by sputtering alloys of the metals Al, Ti, Cr, Ni, Au, Cu, etc. or by reactive plasma deposition of compounds of these materials, and various texture may be produced by multiple layers of different compounds of these materials. In certain embodiments, each of the metal alloys is selected from a group consisting of: $Al_2O_3$, $V_2O_3$, $Cr_2O_3$, $TiO_2$, $NiO$, $(TiAl)N$, $TiN_x$, $ZrN$, $TiZrN$, $TiCN$, $TaN$, $SiC$, $TiAlCN$, $TiC$, $WC$, $TiC_xN_y$, $ZrC_xN_y$, or a combination thereof. Table 1 shows common colors and compositions of decorative coating materials.

TABLE 1

| Color | Composition |
| --- | --- |
| Blue | $Al_2O_3$ + 2-3% $V_2O_3$ |
| Scarlet | $Al_2O_3$ + 2-3% $Cr_2O_3$ |
| Red | $TiO_2$ + 0.5% $Cr_2O_3$ |
| Yellow | $Al_2O_3$ + 0.5-1% $NiO$ |
| Dark blue | $(TiAl)N$ |

TABLE 1-continued

| Color | Composition |
| --- | --- |
| Golden brown | $TiN_x$ |
| Yellow-green | ZrN |
| Golden | TiZrN |
| Bronze | TiCN |
| Blue-grey | TaN |
| Black | SiC |
| Black | TiAlCN |
| Dark grey | TiC/WC |
| Golden-red | $TiC_xN_y$ |
| Silver/gold/violet | $ZrC_xN_y$ |

Figure 6:
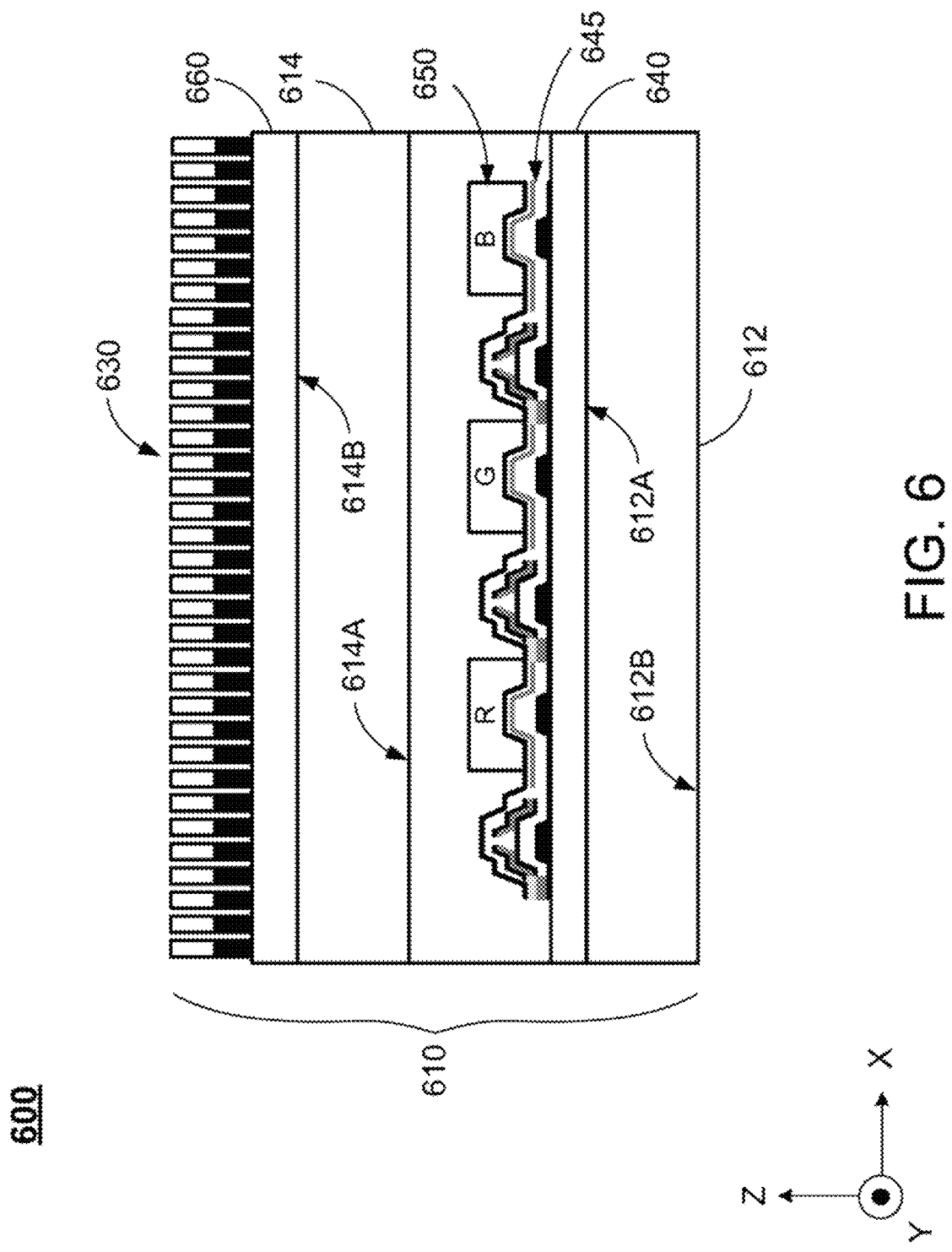
FIG. 6 schematically shows a blended LED display device according to another embodiment of the present disclosure.

In each of the embodiments as discussed above, the blended display device is a LCD device. In certain embodiments, the blended display device may also be implemented by a light emitting diode (LED) display device. For example, FIG. 6 schematically shows a blended LED display device according to another embodiment of the present disclosure. Specifically, FIG. 6 adopts the same three-dimensional X-Y-Z coordinate as provided in FIG. 2A. As shown in FIG. 6, the LED display device 600 includes a LED display panel 610, which may be a micro-LED display device or an organic LED (OLED) display device, and is switchable between a first operational mode (i.e., the display mode) and a second operational mode (i.e., the reflection mode) as described above. Specifically, the LED display panel 610 has a first substrate 612 and a second substrate 614 opposite to each other in a vertical direction, in which the first substrate 612 is located at the back side (i.e., the bottom side as shown in FIG. 6) of the LED display panel 610, and the second substrate 614 is located at a display side (i.e., the top side as shown in FIG. 6) of the LED display panel 610. The first substrate 612 has a first side 612A and a second side 612B opposite to each other, in which the first side 612A (i.e., the upper side as shown in FIG. 6) faces the second substrate 614, and the second side 612B (i.e., the lower side as shown in FIG. 6) faces the back side of the LED display panel 610. Similarly, the second substrate 614 has a third side 614A and a fourth side 614B opposite to each other, in which the third side 614A (i.e., the lower side as shown in FIG. 6) faces the first substrate 612, and the fourth side 614B (i.e., the upper side as shown in FIG. 6) faces the outer environment. At the first substrate 612, an active matrix layer 640 is formed on the first side 612A of the first substrate 612, and a plurality of active matrix switching devices 645 and a plurality of LEDs 650 are provided on the active matrix layer 640 and corresponding to the pixels. The LEDs 650 may be micro-LED chips or OLED chips. In particular, the active matrix switching devices 245 include pixel circuits and thin-film transistors (TFTs) corresponding to the pixels. The active matrix layer 640, the active matrix switching devices 645 and the LEDs 650 collectively form a LED array of the LED display panel 610. At the side of the second substrate 614, a directional NWGP layer 630 and a quarter wave plate 660 are disposed on the fourth side 614B of the second substrate 614 facing the outer environment. In other embodiments, the directional NWGP layer 630 and the quarter wave plate 660 may be disposed on the third side 614A of the substrate 614, such that the directional NWGP layer 630 and the quarter wave plate 660 are located in-cell. Specifically, the quarter wave plate 660 is disposed between the directional NWGP layer 630 and the second substrate 614. The LED display device 600 may be switchable between the first operational mode and the second operational mode. In in the first operational mode (i.e., the display mode), the LEDs 650 in the LED array emits light, and the directional NWGP layer 630 polarizes the light emitted by the LEDs 650 to display the image. In the second operational mode (i.e., the reflection mode), the LEDs 650 do not emit light, and the ambient light incident toward the LED display panel 610 is at least partially reflected by the directional NWGP layer 630 to show the predesigned color pattern.

Figure 7:
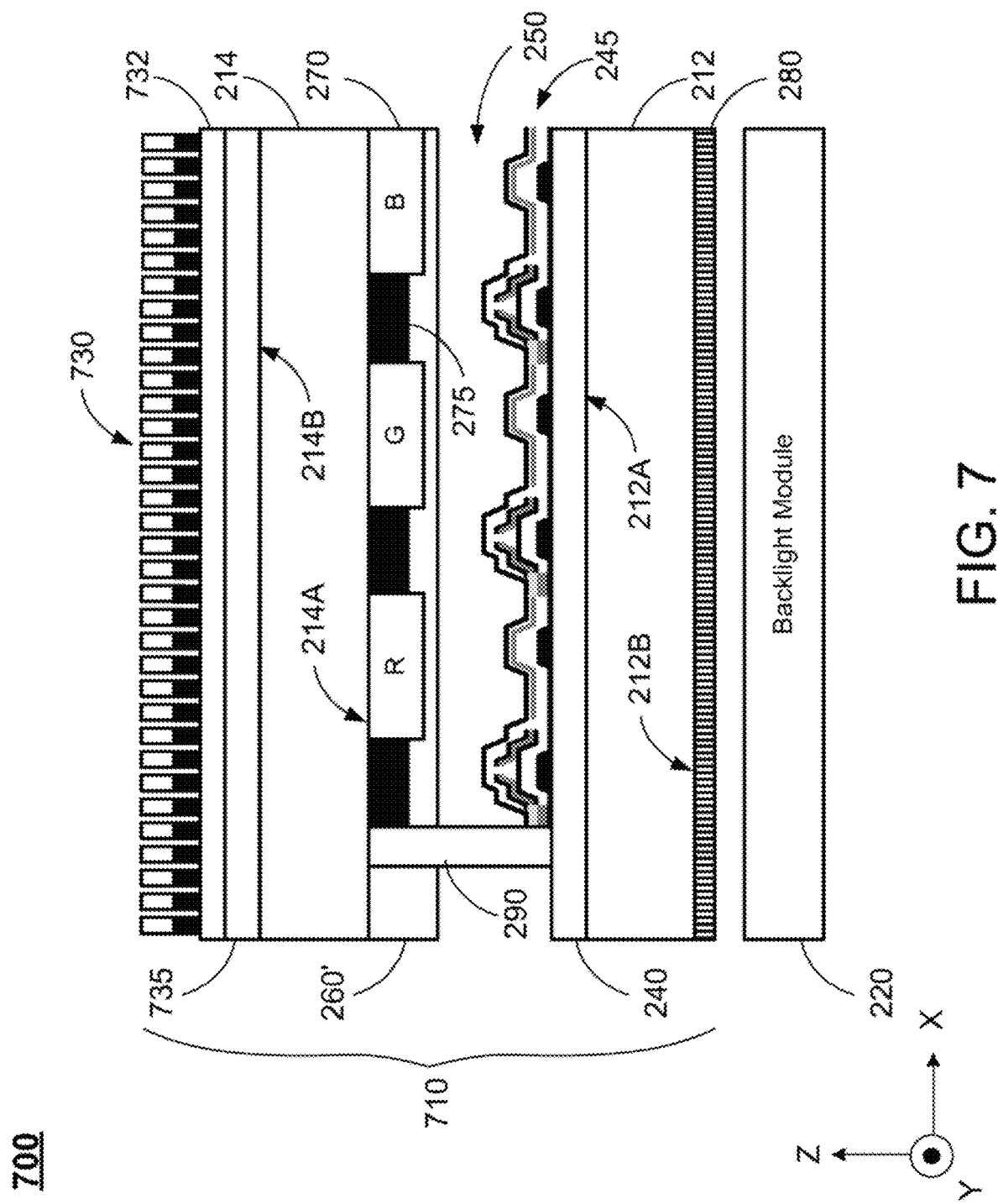
FIG. 7 schematically shows a blended LCD display device according to yet another embodiment of the present disclosure.

FIG. 7 schematically shows a blended LCD display device according to yet another embodiment of the present disclosure. Specifically, FIG. 7 adopts the same three-dimensional X-Y-Z coordinate as provided in FIG. 2A. As shown in FIG. 7, the LCD device 200' includes a display panel 710 and a backlight module 220 disposed at a back side (i.e., the bottom side as shown in FIG. 7) of the display panel 710. The differences between the display panel 710 as shown in FIG. 7 and the display panel 210' as shown in FIG. 2B exist in the structures disposed on the fourth side 214B of the second substrate 214 facing the outer environment. Specifically, a transparent electrode layer 735 is disposed on the fourth side 214B of the second substrate 214 facing the outer environment, and a directional NWGP layer 730 and a piezoelectric polymer layer 732 are disposed on the transparent electrode layer 735. In certain embodiments, the piezoelectric polymer layer 732 may be a polyvinylidene fluoride (PVDF) layer. Specifically, the PVDF layer is one of piezoelectric polymers having two piezoelectric effects: a direct piezoelectric effect and a reverse piezoelectric effect. In particular, the PVDF layer generates an electric charge when an external stress (mechanical, acoustic, or thermal) is applied, which is the direct piezoelectric effect, and undergoes a mechanical deformation when an electric field is applied, which is the reverse piezoelectric effect.

As shown in FIG. 7, the piezoelectric polymer layer 732 is disposed between the directional NWGP layer 730 and the transparent electrode layer 735. The transparent electrode layer 735 is used to generate an external alternate current (AC) electric field, which is applied to the piezoelectric polymer layer 732 such that the piezoelectric polymer layer 732 generates a mechanical vibration due to the inverse piezoelectric effect. In particular, the inverse piezoelectric effect refers to a deformation of the materials that results from the application of an electric field. The deformation could lead to either tensile or compressive strains and stresses in the material depending upon the direction of the electric field, as a result of deformation generates a mechanical vibration. Specifically, the external AC electric field may be generated by providing a first AC signal to the directional NWGP layer 730 and a second AC signal to the transparent electrode layer 735, where the first AC signal and the second AC signal have different frequencies. In one embodiment, the reverse piezoelectric effect of the PVDF layer may be adopted to generate the mechanical vibration. Specifically, when the external AC electric field is applied, the PVDF layer is stretched in its horizontal direction and compressed in its vertical direction, which is in the direction of its thickness. When the external AC electric field is withdrawn, the PVDF layer returns back to its original shape. Thus, the AC voltage makes the PVDF layer vibrate.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display device, comprising:
   a display panel configured to switch between a first operational mode and a second operational mode, wherein the display panel has a first substrate and a second substrate opposite to each other in a vertical direction, the first substrate is located at a back side of the display panel, and the second substrate is located at a display side of the display panel; and
   a directional nanowire grid polarizer (NWGP) layer disposed on the second substrate, wherein the directional NWGP layer has a NWGP direction perpendicular to the vertical direction, and the directional NWGP layer comprises at least one colored coating disposed on at least one pattern region;
   wherein in the first operational mode, the directional NWGP layer functions as a polarizer for the display panel, and the display panel is configured to display an image; and
   wherein in the second operational mode, the display panel does not display an image, and an ambient light incident toward the display panel is at least partially reflected by the at least one pattern region of the directional NWGP layer to show a predesigned color pattern.

2. The display device of claim 1, wherein the display panel is a liquid crystal display (LCD) panel comprising:
   a backlight module configured to switch between the first operational mode and the second operational mode; and
   a display cell structure, comprising:
      the first substrate and the second substrate spaced apart from each other in the vertical direction, forming a cell gap therebetween, wherein the first substrate has a first side facing the cell gap and a second side opposite to the first side and facing the backlight module, and the directional NWGP layer is disposed on the second substrate;
      a polarizer layer disposed on the second side of the first substrate, wherein the polarizer layer has a polarizing direction perpendicular to the NWGP direction and the vertical direction; and
      a LCD structure disposed in the cell gap, having liquid crystal molecules with a dielectric constant anisotropy;
   wherein in the first operational mode, the backlight module emits light toward the display cell structure, the polarizer layer polarizes the light emitted by the backlight module, and the LCD structure is controlled to allow the polarized light polarized by the polarizer layer to pass through the LCD structure and the directional NWGP layer and to display the image; and
   wherein in the second operational mode, the backlight module does not emit light toward the display cell structure, and the ambient light incident toward the display cell structure is at least partially reflected by the directional NWGP layer to show the predesigned color pattern.

3. The display device of claim 2, wherein the second substrate has a third side facing the cell gap and a fourth side opposite to the third side, and the directional NWGP layer is disposed on the third side of the second substrate.

4. The display device of claim 2, wherein the second substrate has a third side facing the cell gap and a fourth side opposite to the third side, and the directional NWGP layer is disposed on the fourth side of the second substrate.

5. The display device of claim 2, wherein the LCD structure comprises:
   a liquid crystal layer disposed in the cell gap, having the liquid crystal molecules and defining a plurality of pixels; and
   an active matrix layer disposed on the first side of the first substrate, wherein the active matrix layer comprises a plurality of pixel circuits corresponding to the pixels;
   wherein for each of the pixels, in the first operational mode, the pixel circuits of the active matrix layer correspondingly provide a voltage to drive the liquid crystal molecules of the liquid crystal layer to allow the polarized light polarized by the polarizer layer to pass through the liquid crystal layer and the directional NWGP layer to display an image.

6. The display device of claim 2, wherein the LCD panel further comprises at least one sealant disposed in the cell gap to seal the liquid crystal molecule within the LCD structure, and the directional NWGP layer overlaps with a projection of the at least one sealant along the vertical direction.

7. The display device of claim 1, wherein the display panel is a light emitting diode (LED) display panel comprising:
   the first substrate and the second substrate spaced apart from each other in the vertical direction, wherein the directional NWGP layer is disposed on a side of the second substrate away from the first substrate;
   a LED array disposed between the first substrate and the second substrate, having a plurality of LEDs and defining a plurality of pixels; and
   a quarter wave plate disposed between the directional NWGP layer and the second substrate;
   wherein in the first operational mode, the LED array emits light, and the directional NWGP layer polarizes the light emitted by the LED array to display the image; and
   wherein in the second operational mode, the LED array does not emit light, and the ambient light incident toward the LED display panel is at least partially reflected by the directional NWGP layer to show the predesigned color pattern.

8. The display device of claim 7, wherein each of the LEDs is an organic LED (OLED).

9. The display device of claim 1, wherein the directional NWGP layer is formed by a plurality of wire grid lines extending in parallel along the NWGP direction, and a pitch between the wire grid lines is less than $\lambda/2$, wherein $\lambda$ is a wavelength of the light.

10. The display device of claim 9, wherein a space between two adjacent ones of the wire grid lines is in a range between 50 nm and 100 nm, a width of each of the wire grid lines is in a range between 50 nm and 100 nm, and a height of each of the wire grid lines along the vertical direction is in a range between 150 nm and 350 nm.

11. A method of forming the directional NWGP layer of the display device of claim 10, comprising:
   forming one or more color coating layers on the second substrate by sputtering the metal alloys or by reactive plasma deposition of the metal alloys;
   forming an aluminum layer on the color coating layers; and imprinting the aluminum layer and the color coating layers to form a plurality of wire grid lines extending in parallel along the NWGP direction, wherein the wire grid lines form the directional NWGP layer, and the color coating layers form the colored coatings.

12. The method of claim 11, wherein a pitch between the wire grid lines is less than $\lambda/2$, wherein $\lambda$ is a wavelength of the light.

13. The method of claim 12, wherein a space between two adjacent ones of the wire grid lines is in a range between 50 nm and 100 nm, a width of each of the wire grid lines is in a range between 50 nm and 100 nm, and a height of each of the wire grid lines along the vertical direction is in a range between 150 nm and 350 nm.

14. The method of claim 11, wherein each of the pattern regions corresponds to a different one of the metal alloys, and each of the metal alloys is selected from a group consisting of: $Al_2O_3$, $V_2O_3$, $Cr_2O_3$, $TiO_2$, NiO, (TiAl)N, $TiN_x$, ZrN, TiZrN, TiCN, TaN, SiC, TiAlCN, TiC, WC, $TiC_xN_y$, $ZrC_xN_y$, or a combination thereof.

15. The display device of claim 1, wherein the directional NWGP layer comprises a plurality of colored coatings forming a plurality of pattern regions, each of the pattern regions is formed by a corresponding metal alloy, and in the second operational mode, the ambient light incident toward the display panel is at least partially reflected by the pattern regions to shown a multi-colored texture as the predesigned color pattern.

16. The display device of claim 15, wherein the colored coatings are formed by a plurality of metal alloys, each of the pattern regions corresponds to a different one of the metal alloys, and each of the metal alloys is selected from a group consisting of: $Al_2O_3$, $V_2O_3$, $Cr_2O_3$, $TiO_2$, NiO, (TiAl)N, $TiN_x$, ZrN, TiZrN, TiCN, TaN, SiC, TiAlCN, TiC, WC, $TiC_xN_y$, $ZrC_xN_y$, or a combination thereof.

17. The display device of claim 1, further comprising:
a piezoelectric polymer layer disposed on a side of the second substrate away from the first substrate, wherein an external alternate current (AC) electric field is applied to the piezoelectric polymer layer such that the piezoelectric polymer layer generates a mechanical vibration.

18. The display device of claim 17, wherein the piezoelectric polymer layer is a polyvinylidene fluoride (PVDF) layer.

19. The display device of claim 17, wherein the external AC electric field is generated by providing a first AC signal to the directional NWGP layer which is conductive material and a second AC signal to a transparent conductive electrode layer, wherein the piezoelectric polymer layer is disposed between the directional NWGP layer and the transparent electrode layer, and the first AC signal and the second AC signal have different frequencies.

20. The display device of claim 17, further comprising a transparent electrode layer disposed between the second substrate and the piezoelectric polymer layer, wherein the at least one directional NWGP layer is disposed on the piezoelectric polymer layer such that the piezoelectric polymer layer is sandwiched by the transparent electrode layer and the at least one directional NWGP layer.

* * * * *